(12) United States Patent
Hou

(10) Patent No.: US 12,277,981 B2
(45) Date of Patent: Apr. 15, 2025

(54) ANTI-FUSE CELL STRUCTURE, ANTI-FUSE ARRAY, OPERATION METHOD FOR ANTI-FUSE ARRAY, AND MEMORY

(71) Applicant: CHANGXIN MEMORY TECHNOLOGIES, INC., Hefei (CN)

(72) Inventor: Chuangming Hou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 18/295,839

(22) Filed: Apr. 4, 2023

(65) Prior Publication Data

US 2024/0006006 A1 Jan. 4, 2024

Related U.S. Application Data

(63) Continuation of application No. PCT/CN2022/105661, filed on Jul. 14, 2022.

(30) Foreign Application Priority Data

Jul. 4, 2022 (CN) .......................... 202210786964.8

(51) Int. Cl.
*G11C 17/16* (2006.01)
*G11C 17/18* (2006.01)
*H10B 20/25* (2023.01)

(52) U.S. Cl.
CPC .............. *G11C 17/16* (2013.01); *G11C 17/18* (2013.01); *H10B 20/25* (2023.02)

(58) Field of Classification Search
CPC ................................. G11C 17/16; H10B 20/25
USPC .................................................... 365/96
See application file for complete search history.

(56) References Cited

U.S. PATENT DOCUMENTS

| | | | | |
|---|---|---|---|---|
| 5,886,940 | A * | 3/1999 | Morzano | G11C 17/18 365/204 |
| 8,199,590 | B1 * | 6/2012 | Novosel | G11C 17/16 365/230.03 |
| 2008/0117661 | A1 * | 5/2008 | Holtzclaw | H04N 25/00 257/E21.666 |
| 2017/0076757 | A1 * | 3/2017 | Wu | G11C 11/24 |
| 2021/0272642 | A1 * | 9/2021 | Noguchi | G11C 11/4085 |
| 2021/0312998 | A1 * | 10/2021 | Yan | G11C 17/16 |
| 2023/0363152 | A1 * | 11/2023 | Hou | H10B 20/25 |

\* cited by examiner

*Primary Examiner* — Muna A Techane
(74) *Attorney, Agent, or Firm* — Syncoda LLC; Feng Ma

(57) ABSTRACT

An anti-fuse cell structure includes: a first anti-fuse transistor having a first end and a second end; a first selection transistor having a first end and a second end, the first end of the first selection transistor being electrically connected to the second end of the first anti-fuse transistor; and a Blow Enable (BE) line electrically connected to a first end of the first anti-fuse transistor, and configured to perform programming operation on the first anti-fuse transistor.

15 Claims, 5 Drawing Sheets

ANTI-FUSE CELL STRUCTURE, ANTI-FUSE ARRAY, OPERATION METHOD FOR ANTI-FUSE ARRAY, AND MEMORY

CROSS-REFERENCE TO RELATED APPLICATIONS

This is a continuation of International Application No. PCT/CN2022/105661 filed on Jul. 14, 2022, which claims priority to Chinese Patent Application No. 202210786964.8, filed on Jul. 4, 2022. The disclosures of the above-referenced applications are hereby incorporated by reference in their entireties.

BACKGROUND

One-time programmable devices based on anti-fuse technology are widely used in memories, such as Dynamic Random Access Memory (DRAM), NAND memory and other memories. The anti-fuse device is a semiconductor device that includes two conductive layers and a dielectric layer between the conductive layers. When the anti-fuse device is not programmed, the conductive layers are separated by the dielectric layer, and both ends of the anti-fuse are open. When the anti-fuse device is programmed (high voltage is applied), the dielectric layer is broken down by high electric field, and an electrical connection is formed between the conductive layers on both sides, so that the anti-fuse is short-circuited (melted). This melting process is physically disposable, permanent and irreversible. The two states before and after melting of the anti-fuse can represent logic "0" and logic "1" respectively. However, the current anti-fuse cell structure and anti-fuse array including multiple anti-fuse cell structures have some problems, such as the risk of breakdown of selective transistors, large chip area and poor uniformity.

Therefore, how to optimize the anti-fuse cell structure and anti-fuse array is an urgent technical problem to be solved at the current stage.

SUMMARY

The disclosure relates to the technical field of integrated circuits, and in particular, to an anti-fuse cell structure, an anti-fuse array, an operation method for an anti-fuse array, and a memory.

In view of this, embodiments of the present disclosure provide an anti-fuse cell structure, an anti-fuse array, an operation method for an anti-fuse array, and a memory.

According to a first aspect of the embodiments of the present disclosure, there is provided an anti-fuse cell structure including: a first anti-fuse transistor, having a first end and a second end; a first selection transistor, having a first end and a second end, the first end of the first selection transistor being electrically connected to the second end of the first anti-fuse transistor; and a Blow Enable (BE) line, electrically connected to the first end of the first anti-fuse transistor, and configured to perform programming operation on the first anti-fuse transistor.

According to a second aspect of the embodiments of the present disclosure, an anti-fuse array is provided. The anti-fuse array includes a plurality of first anti-fuse transistors arranged in an array and a plurality of first selection transistors arranged in an array, each of the first anti-fuse transistors having a first end and a second end, and each first selection transistor having a first end and a second end, where each of the first anti-fuse transistors corresponds to a respective one of the first selection transistors, and the first end of each first selection transistor is electrically connected to the second end of the respective first anti-fuse transistor; a plurality of bit lines, where each of the bit lines is electrically connected to the second ends of a column of the first selection transistors; and a plurality of BE lines, where each of the BE lines is electrically connected to the first ends of a column of the first anti-fuse transistors, and the BE lines are configured to perform programming operation on the first anti-fuse transistors.

According to a third aspect of the embodiments of the present disclosure, an operation method for an anti-fuse array is provided. The operation method includes: providing an anti-fuse array according to any of the above embodiments; and performing programming operation or read operation on the anti-fuse array. The anti-fuse array includes a plurality of first anti-fuse transistors arranged in an array and a plurality of first selection transistors arranged in an array, each of the first anti-fuse transistors having a first end and a second end, and each first selection transistor having a first end and a second end, where each of the first anti-fuse transistors corresponds to a respective one of the first selection transistors, and the first end of each first selection transistor is electrically connected to the second end of the respective first anti-fuse transistor; a plurality of bit lines, where each of the bit lines is electrically connected to the second ends of a column of the first selection transistors; and a plurality of BE lines, where each of the BE lines is electrically connected to the first ends of a column of the first anti-fuse transistors, and the BE lines are configured to perform programming operation on the first anti-fuse transistors.

BRIEF DESCRIPTION OF THE DRAWINGS

In order to describe the technical solutions of the embodiments of the present disclosure more clearly, drawings required to be used in the embodiments of the present disclosure will be briefly introduced below. Apparently, the drawings described below only shows some embodiments of the present disclosure. Those of ordinary skill in the art also can obtain other drawings according to these drawings without doing creative work.

REFERENCE NUMERALS

Figure 1:
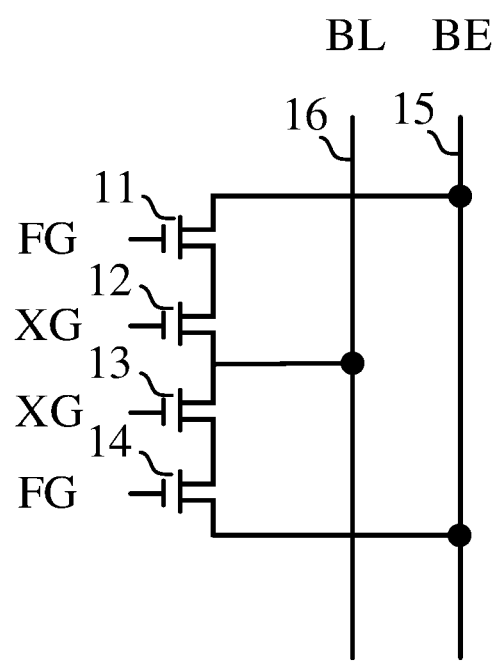
FIG. 1 is a circuit diagram of an anti-fuse cell structure according to an embodiment of the present disclosure.

11—first anti-fuse transistor; 12—first selection transistor; 13—second selection transistor; 14—second anti-fuse transistor; 15—BE line; 16—bit line; 17—active area; 21—first anti-fuse transistor gate line; 211—fourth contact plug; 212—fourth connector; 22—first selection transistor gate line; 221—fifth contact plug; 222—fifth connector; 23—second selection transistor gate line; 24—second anti-fuse transistor gate line; 25—first doped region; 251—first contact plug; 252—first connector; 26—first common doped region; 27—second common doped region; 271—second contact plug; 272—second connector; 273—sixth contact plug; 28—third common doped region; 29—second doped region; 291—third contact plug; 292—third connector.

DETAILED DESCRIPTION

Exemplary implementations of the disclosure will be described below more comprehensively with reference to the drawings. Although the exemplary implementations of the disclosure are shown in the drawings, it should be understood that, the disclosure may be implemented in various forms and should not be limited by the specific implementations elaborated herein. On the contrary, these implementations are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described herein, and the known functions and structures are not described in detail.

In the drawings, the sizes of layers, areas and elements and their relative sizes may be exaggerated for clarity. The same drawing signs represent the same elements throughout.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers and/or parts may be described with terms "first", "second", "third", etc., these elements, components, areas, layers and/or parts should not be limited to these terms. These terms are used only to distinguish one element, component, area, layer or part from another element, component, area, layer or part. Therefore, a first element, component, area, layer or part discussed below may be represented as a second element, component, area, layer or part without departing from the teaching of the disclosure. However, when the second element, component, area, layer or part is discussed, it does not mean that the first element, component, area, layer or part must exist in the disclosure.

In order to conveniently describe, spatially relational terms such as "below", "under", "lower", "beneath", "above", and "upper" may be used herein for describing a relationship between one element or feature and another element or feature illustrated in the figure. It is to be understood that, in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may include otherwise orientation (rotation by 90 degrees or in other orientations) and the spatial descriptors used herein may be interpreted accordingly.

The terms used herein are intended only to describe specific embodiments and are not a limitation of the disclosure. As used herein, singular forms "a/an", "one", and "the" may also be intended to include the plural forms, unless otherwise specified forms in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, term "and/or" includes any and all combinations of the related listed items.

In order to thoroughly understand the present disclosure, detailed steps and detailed structure will be set forth in the following description in order to illustrate the technical aspects of the present disclosure. Preferred embodiments of the present disclosure are described in detail below however the present disclosure may have other embodiments in addition to these detailed descriptions.

At present, in the general anti-fuse cell structure, the anti-fuse transistor is electrically connected to the bit line by the selection transistor, and the voltage difference between the bit line (BL) and the gate of the anti-fuse transistor is utilized, so that the thin gate oxide of the anti-fuse transistor is broken down under high voltage and the resistance is significantly reduced, thus achieving the purpose of programming or writing. However, the current structure often has the risk of failure and occupies a large chip area.

Based on this, the embodiments of the present disclosure provide an anti-fuse cell structure. FIG. 1 is a circuit diagram of the anti-fuse cell structure according to an embodiment of the present disclosure, and FIG. 2 is a schematic structural diagram of the anti-fuse cell structure according to an embodiment of the present disclosure.

Figure 2:
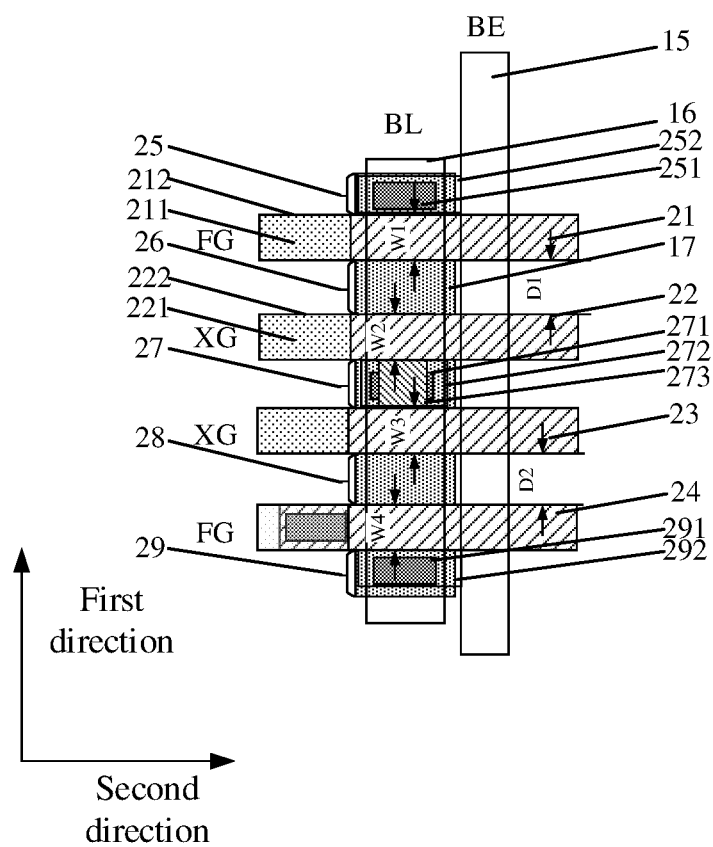
FIG. 2 is a schematic structural diagram of an anti-fuse cell structure according to an embodiment of the present disclosure.

With reference to FIG. 1 and FIG. 2, the anti-fuse cell structure includes a first anti-fuse transistor 11 having a first end and a second end; a first selection transistor 12 having a first end and a second end, the first end of the first selection transistor 12 being electrically connected to the second end of the first anti-fuse transistor 11; a BE line 15 electrically connected to a first end of the first anti-fuse transistor 11 and configured to perform programming operation on the first anti-fuse transistor 11. In practical applications, the second end of the first selection transistor 12 may be electrically connected to the bit line 16.

According to the anti-fuse cell structure provided by the embodiments of the present disclosure, a control terminal of a BE line is added, and an anti-fuse transistor has one end electrically connected to the BE line, and the other end electrically connected to a selection transistor. In this way, when the anti-fuse transistor is programmed, the anti-fuse transistor is broken down by a voltage difference between the control terminal of the BE line and a gate of the anti-fuse transistor. The selection transistor does not need to be turned on, and the high voltage by which the anti-fuse transistor is broken down is not required to pass through the selection transistor, so that the selection transistor is prevented from being damaged.

In the embodiment of the present disclosure, the first end and the second end of the first anti-fuse transistor 11 may be a first electrode and a second electrode of the transistor, respectively. The first electrode may be a source and the second electrode may be a drain; alternatively, the first electrode may be a drain and the second electrode may be a source. The first end and the second end of the first selection transistor 12 may be a first electrode and a second electrode of the selection transistor, respectively. The first electrode may be a source and the second electrode may be a drain; alternatively, the first electrode may be a drain and the second electrode may be a source. In practical applications, the first anti-fuse transistor and the first selection transistor may include a metal oxide semiconductor (MOS) transistor, such as a P-type metal oxide semiconductor (PMOS) transistor or an N-type metal oxide semiconductor (NMOS) transistor and the like.

In some embodiments, with reference to FIG. 1 and FIG. 2, the anti-fuse cell structure further includes an active area 17 extending along a first direction; a first anti-fuse transistor gate line 21 extending along a second direction and covering a part of the active area 17 to define the first anti-fuse transistor, the first direction intersecting the second direction; and a first selection transistor gate line 22 extending along the second direction and covering a part of the active area 17 to define the first selection transistor. In practical applications, the active area 17 is disposed on the substrate and the substrate may be silicon, silicon germanium, germanium or other suitable semiconductor. An N-type doped region can be formed in the active area by doping with an N-type dopant such as phosphorus, arsenic, other N-type dopants or combinations thereof; and a P-type doped region can be formed in the active area by doping with a P-type dopant such as boron, indium, other P-type dopants or combinations thereof. In practical applications, the active area 17 may include a doped source/drain region. Materials of the first anti-fuse transistor gate line 21 and the first selection transistor gate line 22 include but are not limited to polysilicon, titanium nitride, metallic tungsten, or combinations thereof. The first direction can be perpendicular to the second direction, which can further improve the integration of the structure.

In some embodiments, with reference to FIG. 1 and FIG. 2, the anti-fuse cell structure further includes a second selection transistor gate line 23 extending along the second direction and covering a part of the active area 17 to define a second selection transistor 13; a second anti-fuse transistor gate line 24 extending along the second direction and covering a part of the active area 17 to define a second anti-fuse transistor 14. Materials of the second selection transistor gate line 23 and the second anti-fuse transistor gate line 24 include but are not limited to polysilicon, titanium nitride, metallic tungsten, or combinations thereof.

In some embodiments, with reference to FIG. 1 and FIG. 2, the anti-fuse cell structure further includes a bit line 16 electrically connected to the second end of the first selection transistor 12, located on top of the active area 17 and extending along the first direction. The BE line 15 is located on top of one side of the active area 17 and the BE line is arranged in parallel to the active area 17 and extending along the first direction. Herein, the materials of the bit line 16 and the BE line 15 include, but are not limited to, tungsten (W), copper (Cu), titanium (Ti), tantalum (Ta), titanium nitride (TiN), tantalum nitride (TaN), polysilicon, doped silicon, metal silicide, metal alloy, or any combination thereof. In practical applications, the active area may be located on the substrate, the BE line may be located in one metal layer on the substrate, and the bit line 16 may be located in another metal layer on the substrate, the another metal layer may be located on the side of the metal layer away from the substrate. The orthographic projection of the bit line on the substrate plane is partially overlapped with the orthographic projection of the active area on the substrate plane, and the orthographic projection of the BE line on the substrate plane is located on one side of the orthographic projection of the active area on the substrate plane.

In some embodiments, with reference to FIG. 1 and FIG. 2, the anti-fuse cell structure further includes a first doped region 25 and the first common doped region 26, respectively located within the active area 17 on both sides of the first anti-fuse transistor gate line 21; and a first common doped region 26, where the first common doped region 26 and the second common doped region 27 respectively located in the active area 17 on both sides of the first selection transistor gate line 22. The second common doped region 27 is electrically connected to the bit line 16, and the first doped region 25 is electrically connected to the BE line 15. The first doped region 25 and the first common doped region 26 may be the first end and the second end of the first anti-fuse transistor 11 respectively. The first common doped region 26 and the second common doped region 27 may be the first end and the second end of the first selection transistor 12 respectively. The second end of the first anti-fuse transistor 11 is electrically connected to the first end of the first selection transistor 12 through the first common doped region 26, therefore, the area of the doped region is reduced and the space utilization rate can be improved.

In some embodiments, with reference to FIG. 1 and FIG. 2, the anti-fuse cell structure further includes a third common doped region 28, where the second common doped region 27 and the third common doped region 28 are respectively located in the active area 17 on both sides of the second selection transistor gate line 23; and a second doped region 29, where the third common doped region 28 and the second doped region 29 are respectively located in the active area 17 on both sides of the second anti-fuse transistor gate line 24. The second doped region 29 is electrically connected to the BE line 15. The second common doped region 27 and the third common doped region 28 may be a first end and a second end of the second selection transistor 13 respectively. The second end of the first selection transistor is electrically connected to the first end of the second selection transistor through the second common doped region 27, so that space utilization can be improved. The third common doped region 28 and the second doped region 29 may be a first end and a second end of the second anti-fuse transistor 14 respectively. The second end of the second selection transistor is electrically connected to the first end of the second anti-fuse transistor through the third common doped region 28, so that space utilization can be improved.

In practical applications, the first doped region 25, the first common doped region 26, the second common doped region 27, the third common doped region 28 and the second doped region 29 may be heavily doped regions and may be formed by ion implantation into the active area 17. All doped regions may have the same doping concentration, and may be N-type heavily doped or P-type heavily doped. The first common doped region 26 is a drain/source common to the first anti-fuse transistor 11 and the first selection transistor 12, the second common doped region 27 is a drain/source common to the first selection transistor 12 and the second selection transistor 13, and the third common doped region 28 is a drain/source common to the second selection transistor 13 and the second anti-fuse transistor 14.

In some embodiments, with reference to FIG. 1 and FIG. 2, a width W1 of the first anti-fuse transistor gate line along the first direction is less than or equal to a width W2 of the first selection transistor gate line along the first direction;

and a width W4 of the second anti-fuse transistor gate line along the first direction is less than or equal to a width W3 of the second selection transistor gate line along the first direction. The first anti-fuse transistor gate line, the first selection transistor gate line, the second selection transistor gate line and the second anti-fuse transistor gate line may be formed simultaneously, and the forming process of these gate lines includes but is not limited to various patterning processes and the like. In this way, the difficulty of the preparation of the mask and the difficulty of the patterning process can be reduced, and the uniformity of the subsequently formed anti-fuse array can be improved simultaneously.

It can be appreciated that, in the embodiments of the present disclosure, both the first anti-fuse transistor 11 and the second anti-fuse transistor 14 may have a smaller channel length (e.g. a larger leakage current is present between the first and second ends of the anti-fuse transistor, i.e. the first end and second end of the anti-fuse transistor may be considered to be somewhat conductive to each other), so as to ensure that after the gate dielectric layer of the anti-fuse transistor is broken down, the gate of the anti-fuse transistor is conductive to both the first end and the second end of the anti-fuse transistor.

In some embodiments, the width W1 of the first anti-fuse transistor gate line along the first direction may be equal to the width W4 of the second anti-fuse transistor gate line along the first direction, and the width W2 of the first selection transistor gate line along the first direction may be equal to the width W3 of the second selection transistor gate line along the first direction. A combination of the first anti-fuse transistor gate line and the first selection transistor gate line and a combination of the second selection transistor gate line and the second anti-fuse transistor gate line are distributed axisymmetrically. In this way, the first anti-fuse transistor and the second anti-fuse transistor are arranged in mirror image symmetry, and the first selection transistor and the second selection transistor are arranged in mirror image symmetry, so that the uniformity of the subsequently formed anti-fuse array can be improved.

In some embodiments, with reference to FIG. 1 and FIG. 2, a distance between the first anti-fuse transistor gate line and the first selection transistor gate line is a first distance D1, and a distance between the second selection transistor gate line and the second anti-fuse transistor gate line is a second distance D2, where the first distance D1 is equal to the second distance D2. This can further improve the uniformity of the subsequently formed anti-fuse array. In some other embodiments, the width W1 of the first anti-fuse transistor gate line along the first direction, the width W2 of the first selection transistor gate line along the first direction, the width W3 of the second selection transistor gate line along the first direction, the width W4 of the second anti-fuse transistor gate line along the first direction, the first distance D1 and the second distance D2 are all equal.

It can be appreciated that, at present, in the general anti-fuse cell structure, the selection transistor is a thick oxygen device with a long gate length, and a large device width is required to make the selection transistor have sufficient current driving capability. In addition, due to the existence of a reverse-biased junction of ND (N-type drain region)/PW (P-type well region) on path of the read current, in order to reduce the series resistance in the read operation, it is generally necessary to dope in the substrate below the anti-fuse transistor gate line of the anti-fuse transistor to form the ion doped region of the anti-fuse transistor. Due to the high doping concentration in the ion doped region of anti-fuse transistor, these doped ions may diffuse near the channel of the selection transistor in high temperature process, which will significantly reduce the opening voltage of the selection transistor and increase the leakage current. Therefore, the anti-fuse transistor gate line of anti-fuse transistor must be kept a large distance from the selection transistor gate line. Therefore, it is difficult to further reduce the areas of the anti-fuse cell structure and the anti-fuse array. The anti-fuse cell structure provided by the embodiments of the present disclosure can reduce the width of the selection transistor gate line to coincide with the width of the gate line (FG) of the anti-fuse transistor without significantly reducing the length of the gate line (XG) of the selection transistor. Simultaneously, by reducing the width of the anti-fuse transistor gate line of the anti-fuse transistor, the source-drain doped region on both sides of the anti-fuse transistor gate line will significantly reduce the barrier of the reverse-biased junction and increase the read current under the action of the depletion layer. The ion doped region of the anti-fuse transistor does not need to be provided, so that the distance between the anti-fuse transistor gate line of the anti-fuse transistor and the selection transistor gate line can be further reduced. Simultaneously, the mask for preparing ion doped region of anti-fuse transistor is omitted, which reduces the chip manufacturing cost.

In some embodiments, with reference to FIG. 1 and FIG. 2, the anti-fuse cell structure further includes: a first contact plug 251 located on a first doped region 25; a first connector 252, where the BE line 15 is electrically connected to the first contact plug 251 through the first connector; a second contact plug 271 located on the second common doped region 27; a second connector 272, where the bit line 16 is electrically connected to the second contact plug 271 through the second connector 272; a third contact plug 291 located on the second doped region 29; and a third connector 292, where the BE line 15 is electrically connected to the third contact plug 291 through the third connector 292. Herein, the first connector 252, the second connector 272 and the third connector 292 may be of the same film layer or may be of different film layers. For example, they may be located in the same metal layer as the enable signal line 15. In some other embodiments, the anti-fuse cell structure further includes a sixth contact plug 273, where the bit line 16 is electrically connected to the second connector 272 through the sixth contact plug 273. In this way, the bit line 16 and the enable signal line 15 are located in different metal layers to avoid signal crosstalk, and wiring flexibility is increased.

In some embodiments, the anti-fuse cell structure further includes: a fourth contact plug 211, where the gate line 21 of the first anti-fuse transistor is electrically connected to the fourth connector 212 through the fourth contact plug 211; a fifth contact plug 221, where the first selection transistor gate line 22 is electrically connected to the fifth connector 222 through the fifth contact plug 221. The fourth connector 212 and the fifth connector 222 may be of the same film layer or may be of different film layers.

Figure 3:
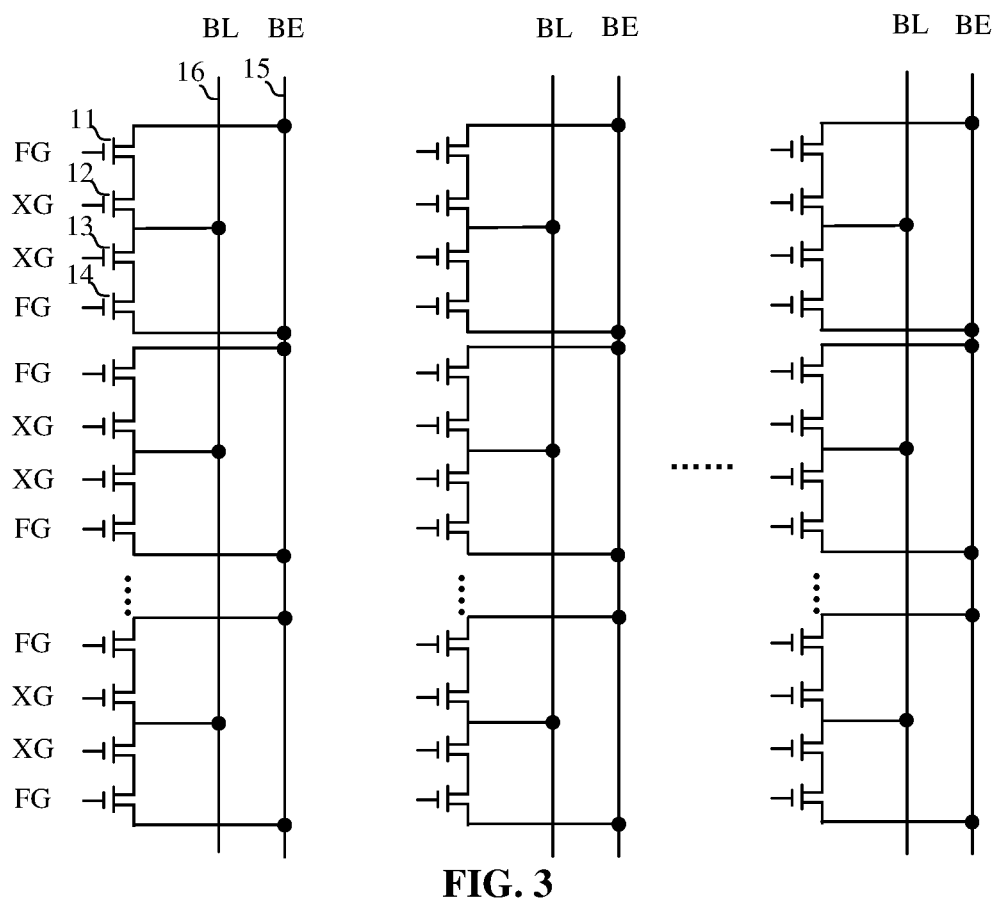
FIG. 3 is a circuit diagram of another anti-fuse array according to an embodiment of the present disclosure.

The embodiments of the disclosure also provide an anti-fuse array. FIG. 3 is a circuit diagram of the anti-fuse array according to an embodiment of the disclosure, and FIG. 4 is a schematic structural diagram of the anti-fuse array according to an embodiment of the disclosure.

Figure 4:
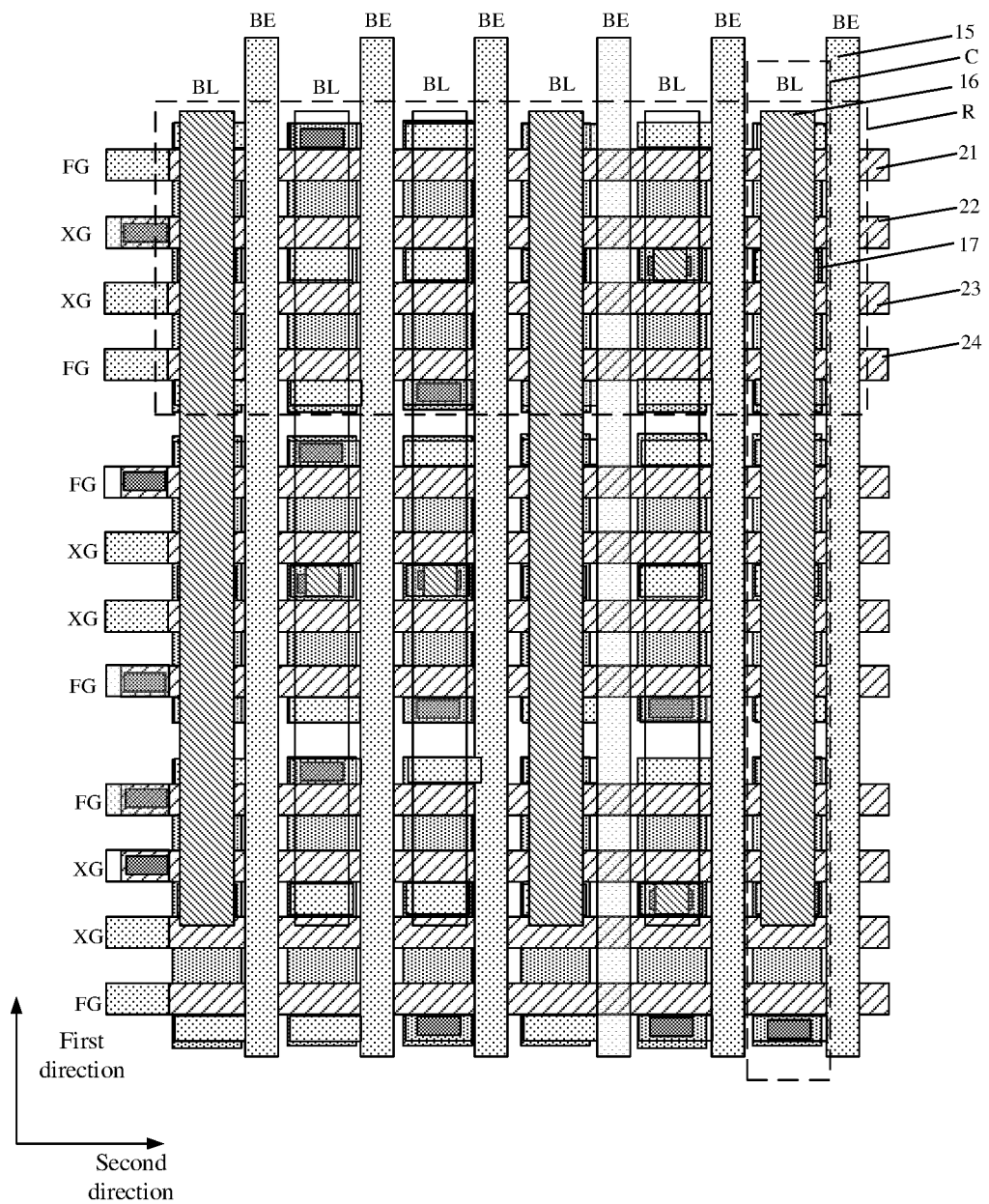
FIG. 4 is a schematic structural diagram of another anti-fuse array according to an embodiment of the present disclosure.

With reference to FIG. 3 and FIG. 4, the anti-fuse array includes: multiple first anti-fuse transistors 11 arranged in an array and multiple first selection transistors 12 arranged in an array, each of the first anti-fuse transistor 11 has a first end and a second end, and each of the first selection transistors 12 has a first end and a second end, where each of the first anti-fuse transistors 11 corresponds to a respective one of the first selection transistors 12, and the first end of each of the first selection transistors 12 is electrically connected to the second end of the respective first anti-fuse transistor 11; multiple bit lines 16, each of bit lines 16 is electrically connected to the second ends of a column of the first selection transistors 12; and A multiple BE lines 15, each of the BE lines 15 is electrically connected to the first ends of a column of the first anti-fuse transistors 11, and the BE lines 15 are configured to perform programming operation on the first anti-fuse transistors 11. In the embodiments of the present disclosure, the first end and the second end of the first anti-fuse transistor 11 may be a first electrode and a second electrode of the transistor, respectively, where the first electrode may be a source and the second electrode may be a drain; alternatively, the first electrode may be a drain and the second electrode may be a source. The first end and the second end of the first selection transistor 12 may be a first electrode and a second electrode of the selection transistor, respectively, where the first electrode may be a source and the second electrode may be a drain; alternatively, the first electrode may be a drain and the second electrode may be a source. In practical applications, the first anti-fuse transistor and the first selection transistor may include an MOS transistor, such as a PMOS transistor or an NMOS transistor.

In some embodiments, with reference to FIG. 3 and FIG. 4, the anti-fuse array further includes multiple active areas 17 arranged as multiple active area rows R extending along a second direction and multiple active area columns C extending along a first direction, where the first direction is perpendicular to the second direction, and each of the active areas 17 extends along the first direction; multiple first anti-fuse transistor gate lines 21, arranged in parallel with each other and extending along a second direction, where each of the first anti-fuse transistor gate lines 21 covers multiple active areas 17 in one of the active area rows R to define the multiple first anti-fuse transistors 11 arranged in the array; multiple first selection transistor gate lines 22, arranged in parallel with each other and extending in the second direction, where each of the first selection transistor gate lines 22 covers multiple active areas 17 in one of the active area rows R to define the multiple first selection transistors 12 arranged in the array. In practical applications, the active area 17 is disposed on the substrate and the substrate may be silicon, silicon germanium, germanium or other suitable semiconductor. An N-type doped region can be formed in the active area by doping with an N-type dopant such as phosphorus, arsenic, other N-type dopants or combinations thereof; and a P-type doped region may be formed in the active area by doping with a P-type dopant such as boron, indium, other P-type dopants or combinations thereof. In practical applications, the Active area 17 may include a source doped region/drain doped region. Materials of the first anti-fuse transistor gate line 21 and the first selection transistor gate line 22 include but are not limited to polysilicon, titanium nitride, metallic tungsten, or combinations thereof. The first direction can be perpendicular to the second direction, which can further improve the integration of the structure In some embodiments, with reference to FIG. 3 and FIG. 4, the anti-fuse array further includes: multiple gate lines 23 of second selection transistors, arranged in parallel with each other and extending along the second direction, where each of the second selection transistor gate lines 23 covers multiple active areas 17 in one of the active area rows C to define the multiple second selection transistors 13 arranged in the array; and multiple gate lines 24 of second anti-fuse transistors, arranged parallel to each other and extending along the second direction, and each of the second anti-fuse transistor gate lines 24 covers multiple active areas 17 in one of the active area rows R to define the multiple second anti-fuse transistors 14 arranged in the array. Materials of the second selection transistor gate lines 23 and the second anti-fuse transistor gate lines 24 include, but are not limited to, polysilicon, titanium nitride, metallic tungsten, or combinations thereof.

In some embodiments, with reference to FIG. 3 and FIG. 4, the multiple BE lines 15 are arranged along the second direction and extend along the first direction, where each of the BE lines 15 and each of the active area columns C are arranged alternately along the second direction; and the multiple bit lines 16 are arranged in parallel with each other and extend along the first direction, where each of the bit lines 16 corresponds to a respective one of the active area columns C, and each bit line 16 is located on top of the respective active area column C. Herein, the materials of the bit line 16 and the BE line 15 include, but are not limited to, W, Cu, Ti, Ta, TiN, TaN, polysilicon, doped silicon, metal silicide, metal alloy, or any combination thereof. In practical applications, the active area may be located on the substrate, the BE line may be located in a metal layer M0, and the bit line 16 may be located in a metal layer M1. The orthographic projection of the bit line on the substrate plane is partially overlapped with the orthographic projection of the active area on the substrate plane.

In some embodiments, the anti-fuse array includes the anti-fuse cell structure of any one of the above embodiments.

In some embodiments, with reference to FIG. 1 to FIG. 4, the anti-fuse array further includes a first doped region 25 and a first common doped region 26, respectively located in the active area 17 on both side of the first anti-fuse transistor gate line 21; and a second common doped region 27, where the first common doped region 26 and the second common doped region 27 are respectively located in the active area 17 on both sides of the first selection transistor gate line 22. The second common doped region 27 is electrically connected to the bit line 16; and the first doped region 25 is electrically connected to the BE line 15.

In some embodiments, with reference to FIG. 1 to FIG. 4, the anti-fuse array further includes a third common doped region 28, where the a second common doped region 27 and the third common doped region 28 are respectively located in the active area 17 on both sides of the second selection transistor gate line 23; and a second doped region 29, where the third common doped region 28 and the second doped region 29 are respectively located in the active area 17 on both sides of the second anti-fuse transistor gate line 24. The second doped region 29 is electrically connected to the BE line 15.

In some embodiments, with reference to FIG. 1 to FIG. 4, a width W1 of the first anti-fuse transistor gate line along the first direction is less than or equal to a width W2 of the first selection transistor gate line along the first direction; and a width W4 of the second anti-fuse transistor gate line along the first direction is less than or equal to a width W3 of the second selection transistor gate line along the first direction. In this way, the difficulty of the preparation of the mask and the difficulty of the patterning process can be reduced, and the uniformity of the anti-fuse array can be improved simultaneously.

In some embodiments, with reference to FIG. 1 to FIG. 4, the width W1 of the first anti-fuse transistor gate line along the first direction may be equal to the width W4 of the second anti-fuse transistor gate line along the first direction, and the width W2 of the first selection transistor gate line along the first direction may be equal to the width W3 of the second selection transistor gate line along the first direction. A combination of the first anti-fuse transistor gate line and the first selection transistor gate line and a combination of the second selection transistor gate line and the second anti-fuse transistor gate line are distributed axisymmetrically. In this way, the first anti-fuse transistor and the second anti-fuse transistor are arranged in mirror image symmetry, and the first selection transistor and the second selection transistor are arranged in mirror image symmetry, so that the uniformity of the subsequently formed anti-fuse array can be improved.

In some embodiments, with reference to FIG. 1 to FIG. 4, a distance between the first anti-fuse transistor gate line and the first selection transistor gate line is a first distance D1, and a distance between the second selection transistor gate line and the second anti-fuse transistor gate line is a second distance D2, where the first distance D1 is equal to the second distance D2. This can further improve the uniformity of the anti-fuse array.

In some embodiments, with reference to FIG. 1 to FIG. 4, the anti-fuse array further includes: a first contact plug 251 located on a first doped region 25; a first connector 252, where the BE line 15 is electrically connected to the first contact plug 251 through the first connector; a second contact plug 271 located on the second common doped region 27; a second connector 272, where the bit line 16 is electrically connected to the second contact plug 271 through the second connector 272; a third contact plug 291 located on the second doped region 29; and a third connector 292, where the BE line 15 is electrically connected to the third contact plug 291 through the third connector 292. In this way, the metal layer where the bit line 16 is located is different from the metal layer where the BE line 15 is located, to avoid signal crosstalk and simultaneously increase wiring flexibility.

Figure 5:
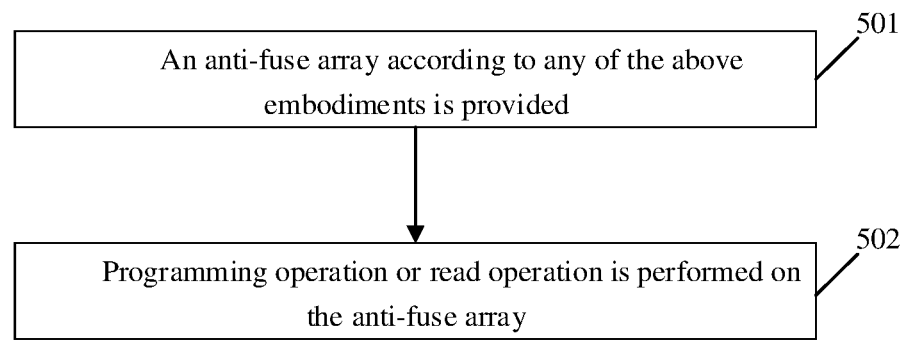
FIG. 5 is a flowchart of an operation method for an anti-fuse array according to an embodiment of the present disclosure.

The embodiments of the present disclosure also provide an operation method for an anti-fuse array, as shown in FIG. 5, the operation method includes operations 501 to 502.

In operation 501, an anti-fuse array according to any of the above embodiments is provided.

In operation 502, programming operation or read operation is performed on the anti-fuse array.

The operation method for an anti-fuse array provided by the embodiments of the present disclosure will be described in further detail below in connection with specific embodiments.

Firstly, with reference to FIG. 3 and FIG. 4, operation 501 is performed to provide an anti-fuse array according to any of the above embodiments.

Secondly, operation 502 is implemented to perform the programming operation or the read operation on the anti-fuse array.

In some embodiments, the programming operation includes: an anti-fuse transistor to be programmed is selected, a first voltage is applied to an anti-fuse transistor gate line of the anti-fuse transistor to be programmed, and other anti-fuse transistor gate lines are set to be floating; all of the selection transistor gate lines are set to be floating; and a second voltage is applied to an BE line electrically connected to the anti-fuse transistor to be programmed. An absolute value of a difference between the first voltage and the second voltage is greater than the breakdown voltage of a gate dielectric layer of the anti-fuse transistor to be programmed (i.e., the gate dielectric layer of the anti-fuse transistor can be broken down). Herein, the gate dielectric layer may be, for example, an oxide layer.

For example, in conjunction with FIG. 4, firstly, the anti-fuse transistor to be programmed is selected. Exemplarily, for example, the anti-fuse transistor to be programmed is located on the active area in the first row and the first column. In some embodiments, the anti-fuse transistor to be programmed includes at least one of the first anti-fuse transistor and the second anti-fuse transistor, and at least one of the first anti-fuse transistor and the second anti-fuse transistor may be melted during the programming operation, i.e. individual programming or synchronous programming of the two may be completed.

Secondly, in conjunction with FIG. 4, a first voltage is applied to the anti-fuse transistor gate line of the anti-fuse transistor to be programmed, other anti-fuse transistor gate lines are set to be floating or the voltages of the other anti-fuse transistor gate lines are set to zero, simultaneously, a second voltage is applied to the BE line electrically connected to the anti-fuse transistor to be programmed located in one side of the active area of the first row and the first column. For example, the first voltage is applied to the anti-fuse transistor gate line of the anti-fuse transistor that covers an active area in the first row and the first column, and other anti-fuse transistor gate lines are set to be floating or the voltages of the other anti-fuse transistor gate lines are set to zero, simultaneously, the second voltage is applied to an BE line located on one side of the active area in the first row and the first column. Taking the breakdown voltage of the gate dielectric layer of the anti-fuse transistor as 6 V as an example, the first voltage may be 6 V for example, and the second voltage may be 0 V for example, and the difference between the first voltage and the second voltage can break down the gate dielectric layer of the anti-fuse transistor, so that the anti-fuse transistor is broken down. In some embodiments, the anti-fuse transistor gate line of the anti-fuse transistor includes the first anti-fuse transistor gate line and the second anti-fuse transistor gate line. The first voltage may be applied to at least one of the first anti-fuse transistor gate line and the second anti-fuse transistor gate line. Thus, one or both of the first anti-fuse transistors and the second anti-fuse transistors are melted, and programming can be completed.

During the programming process, all of the selection transistor gate lines are set to be floating. In conjunction with FIG. 4, all of the first select transistor gate lines and all of the second anti-fuse transistor gate lines are set to be floating. In this way, all the selection transistors are turned off.

In some embodiments, one of the first voltage and the second voltage may be a positive voltage, the other of the first voltage and the second voltage may be a negative voltage, and the absolute value of the first voltage is less than the breakdown voltage of the gate dielectric layer of the anti-fuse transistor, and the absolute value of the second voltage is also less than the breakdown voltage of the gate dielectric layer of the anti-fuse transistor. Herein, the absolute value of voltage is also called the amplitude of voltage. Exemplarily, the breakdown voltage of the gate dielectric layer of the anti-fuse transistor is 6 V, the first voltage may be for example 5 V, and the second voltage may be for example −1 V, at this time, the first voltage has the amplitude of 5 V less than the breakdown voltage of the gate dielectric layer of the anti-fuse transistor, and the second voltage has the amplitude of −1 V less than the breakdown voltage of the gate dielectric layer of the anti-fuse transistor. The amplitude of the difference between the first voltage and the second voltage is 6 V that can break down the gate dielectric layer of the anti-fuse transistor. In this way, the amplitude of the first voltage applied to the anti-fuse transistor gate line of the anti-fuse transistor to be programmed is prevented from being too high, the too high amplitude of the first voltage may cause the misprogramming operation on other anti-fuse transistors located in the same active area row as the anti-fuse transistor to be programmed. For example, the above-mentioned misprogramming operation means that, even if the BE line is set to be floating, other anti-fuse transistors located in the same active area row as the anti-fuse transistor to be programmed may be broken down due to the too high amplitude of the first voltage.

In some embodiments, the read operation includes: an anti-fuse transistor to be read is selected, a third voltage is applied to a selection transistor gate line of a selection transistor electrically connected to the anti-fuse transistor to be read, and other selection transistor gate lines are set to be floating; a fourth voltage is applied to a bit line electrically connected to the anti-fuse transistor to be read, and other bit lines are set to be floating; a fifth voltage is applied to an anti-fuse transistor gate line of the anti-fuse transistor to be read, and other anti-fuse transistor gate lines are set to be floating; and all BE lines are set to be floating. The third voltage is a turn-on voltage of the selection transistor, and an absolute value of a difference between the fourth voltage and the fifth voltage is smaller than a breakdown voltage of a gate dielectric layer of the anti-fuse transistor to be read. It should be noted that the "turn-on voltage" herein refers to the normal working voltage of the selection transistor.

For example, in conjunction with FIG. 4, firstly, the anti-fuse transistor to be read is selected. Exemplarily, for example, an anti-fuse transistor to be read is located on the active area in the first row and the first column.

Then, a third voltage is applied to the selection transistor gate line of the selection transistor electrically connected to the anti-fuse transistor to be read, and other selection transistor gate lines are set to be floating; a fourth voltage is applied to the bit line electrically connected to the anti-fuse transistor to be read, the other bit lines are set to be floating; a fifth voltage is applied to the anti-fuse transistor gate line of the anti-fuse transistor to be read, and other anti-fuse transistor gate lines are set to be floating; simultaneously, all BE lines are set to be floating. For example, a third voltage is applied to the anti-fuse transistor gate line of the anti-fuse transistor, covering the active area in a first row and a first column, and other anti-fuse transistor gate lines are set to be floating; a fourth voltage, may have a value of 1 V for example, is applied to a bit line located on top of the active area in the first row and the first column; and a fifth voltage, which may have a value of 0 V for example, is applied to the anti-fuse transistor gate line of the anti-fuse transistor, covering the active area in the first row and the first column. Herein, the third voltage is the turn-on voltage of the selection transistor. In this way, the current can be read at the bit line terminal, and the memory state can be determined according to the magnitude of the current, so as to implement the reading operation.

Embodiments of the present disclosure also provide a memory including an anti-fuse cell structure as in any one of the above embodiments.

In view of above, according to the anti-fuse cell structure provided by the embodiments of the present disclosure, a control terminal of a BE line is added, and an anti-fuse transistor has one end electrically connected to the BE line, and the other end electrically connected to a selection transistor. In this way, when the anti-fuse transistor is programmed, the anti-fuse transistor is broken down by a voltage difference between the control terminal of the BE line and a gate of the anti-fuse transistor. The selection transistor does not need to be turned on, and the high voltage by which the anti-fuse transistor is broken down is not required to pass through the selection transistor, so that the selection transistor is prevented from being damaged.

It should be noted that the anti-fuse cell structure, the anti-fuse array, the operation method thereof, and the memory provided by the embodiments of the present disclosure can be applied to any integrated circuit including the structure. In the technical scheme described in all embodiments, the technical features can be arbitrarily combined without conflict. Those skilled in the art can change the sequence of the operations of the above-mentioned formation method without departing from the protection scope of the present disclosure. If the operations in the embodiments of the present disclosure do not conflict, some operations may be performed simultaneously, or they may be performed in sequence.

The above are only preferred embodiments of the present disclosure, and are not intended to limit the scope of protection of the present disclosure. Any modification, equivalent replacement and improvement made within the spirit and principles of the present disclosure should be included in the scope of protection of the present disclosure.

According to the anti-fuse cell structure provided by the embodiments of the present disclosure, a control terminal of a BE line is added, and an anti-fuse transistor has one end electrically connected to the BE line, and the other end electrically connected to a selection transistor. In this way, when the anti-fuse transistor is programmed, the anti-fuse transistor is broken down by a voltage difference between the control terminal of the BE line and a gate of the anti-fuse transistor. The selection transistor does not need to be turned on, and the high voltage by which the anti-fuse transistor is broken down is not required to pass through the selection transistor, so that the selection transistor is prevented from being damaged.

What is claimed is:

1. An anti-fuse cell structure, comprising:
 a first anti-fuse transistor, having a first end and a second end;
 a first selection transistor, having a first end and a second end, the first end of the first selection transistor being electrically connected to the second end of the first anti-fuse transistor;
 a blow enable line, electrically connected to the first end of the first anti-fuse transistor, and configured to perform programming operation on the first anti-fuse transistor;
 an active area, extending along a first direction;
 a first anti-fuse transistor gate line, extending along a second direction and covering a part of the active area to define the first anti-fuse transistor, wherein the first direction intersects the second direction;
 a first selection transistor gate line, extending along the second direction and covering a part of the active area to define the first selection transistor; and
 a bit line, electrically connected to the second end of the first selection transistor, located on top of the active area and extending along the first direction, wherein the blow enable line is located on top of one side of the active area, and the blow enable line is arranged in parallel to the active area and extending along the first direction.

2. The structure of claim 1, further comprising:
a first doped region and a first common doped region, respectively located in the active area on both sides of the first anti-fuse transistor gate line; and
a second common doped region, wherein the first common doped region and the second common doped region are respectively located in the active area on both sides of the first selection transistor gate line,
wherein the second common doped region is electrically connected to the bit line, and the first doped region is electrically connected to the blow enable line.

3. The structure of claim 2, further comprising:
a second selection transistor gate line, extending along the second direction and covering a part of the active area to define a second selection transistor; and
a second anti-fuse transistor gate line, extending along the second direction and covering a part of the active area to define a second anti-fuse transistor.

4. The structure of claim 3, further comprising:
a third common doped region, wherein the second common doped region and the third common doped region are respectively located in the active area on both sides of the second selection transistor gate line; and
a second doped region, wherein the third common doped region and the second doped region are respectively located in the active area on both sides of the second anti-fuse transistor gate line,
wherein the second doped region is electrically connected to the blow enable line.

5. The structure of claim 4, wherein:
a width of the first anti-fuse transistor gate line along the first direction is less than or equal to a width of the first selection transistor gate line along the first direction; and
a width of the second anti-fuse transistor gate line along the first direction is less than or equal to a width of the second selection transistor gate line along the first direction.

6. The structure of claim 5, wherein:
the width of the first anti-fuse transistor gate line along the first direction is equal to the width of the second anti-fuse transistor gate line along the first direction, and the width of the first selection transistor gate line along the first direction is equal to the width of the second selection transistor gate line along the first direction, wherein a combination of the first anti-fuse transistor gate line and the first selection transistor gate line and a combination of the second selection transistor gate line and the second anti-fuse transistor gate line are distributed axisymmetrically.

7. The structure of claim 4, further comprising:
a first contact plug, located on the first doped region;
a first connector, wherein the blow enable line is electrically connected to the first contact plug through the first connector;
a second contact plug, located on the second common doped region;
a second connector, wherein the bit line is electrically connected to the second contact plug through the second connector;
a third contact plug, located on the second doped region; and
a third connector, wherein the blow enable line is electrically connected to the third contact plug through the third connector.

8. A memory, comprising the anti-fuse cell structure of claim 1.

9. An anti-fuse array, comprising:
a plurality of first anti-fuse transistors arranged in an array and a plurality of first selection transistors arranged in an array, each of the first anti-fuse transistors having a first end and a second end, and each of the first selection transistors having a first end and a second end, wherein each of the first anti-fuse transistors corresponds to a respective one of the first selection transistors, and the first end of each first selection transistor is electrically connected to the second end of the respective first anti-fuse transistor;
a plurality of bit lines, wherein each of the bit lines is electrically connected to the second ends of a column of the first selection transistors; and
a plurality of blow enable lines, wherein each of the blow enable lines is electrically connected to the first ends of a column of the first anti-fuse transistors, and is not electrically connected to the second ends of the column of the first anti-fuse transistors, and the blow enable lines are configured to perform programming operation on the first anti-fuse transistors.

10. The anti-fuse array of claim 9, further comprising:
a plurality of active areas, arranged as a plurality of active area rows extending along a second direction and a plurality of active area columns extending along a first direction, wherein the first direction is perpendicular to the second direction, and each of the active areas extends along the first direction;
a plurality of first anti-fuse transistor gate lines, arranged in parallel with each other and extending along the second direction, wherein each of the first anti-fuse transistor gate lines covers a plurality of active areas in one of the active area rows to define the plurality of first anti-fuse transistors arranged in the array; and
a plurality of first selection transistor gate lines, arranged in parallel with each other, and extending along the second direction, wherein each of the first selection transistor gate lines covers a plurality of active areas in one of the active area rows to define the plurality of first selection transistors arranged in the array.

11. The anti-fuse array of claim 10, further comprising:
a plurality of second selection transistor gate lines, arranged in parallel with each other, and extending along the second direction, wherein each of the second selection transistor gate lines covers a plurality of active areas in one of the active area rows to define a plurality of second selection transistors arranged in the array; and
a plurality of second anti-fuse transistor gate lines, arranged parallel to each other, and extending along the second direction, and each of the second anti-fuse transistor gate lines covers a plurality of active areas in one of the active area rows to define a plurality of second anti-fuse transistors arranged in the array.

12. The anti-fuse array of claim 11, wherein:
the plurality of the blow enable lines are arranged along the second direction and extend along the first direction, wherein each of the blow enable lines and each of the active area columns are arranged alternately along the second direction; and
the plurality of bit lines are arranged in parallel with each other and extend along the first direction, wherein each of the bit lines corresponds to a respective one of the active area columns, and each bit line is located on top of the respective active area column.

13. An operation method for an anti-fuse array, comprising:
providing an anti-fuse array; and
performing programming operation or read operation on the anti-fuse array,
wherein the anti-fuse array comprises:
a plurality of first anti-fuse transistors arranged in an array and a plurality of first selection transistors arranged in an array, each of the first anti-fuse transistors having a first end and a second end, and each of the first selection transistors having a first end and a second end, wherein each of the first anti-fuse transistors corresponds to a respective one of the first selection transistors, and the first end of each first selection transistor is electrically connected to the second end of the respective first anti-fuse transistor;
a plurality of bit lines, wherein each of the bit lines is electrically connected to the second ends of a column of the first selection transistors; and
a plurality of blow enable lines, wherein each of the blow enable lines is electrically connected to the first ends of a column of the first anti-fuse transistors, and is not electrically connected to the second ends of the column of the first anti-fuse transistors, and the blow enable lines are configured to perform programming operation on the first anti-fuse transistors.

14. The operation method of claim 13, wherein the programming operation comprises:
selecting an anti-fuse transistor to be programmed, applying a first voltage to an anti-fuse transistor gate line of the anti-fuse transistor to be programmed, and setting other anti-fuse transistor gate lines to be floating;
setting all of the selection transistor gate lines to be floating; and
applying a second voltage to a blow enable line electrically connected to the anti-fuse transistor to be programmed,
wherein an absolute value of a difference between the first voltage and the second voltage is greater than a breakdown voltage of a gate dielectric layer of the anti-fuse transistor to be programmed.

15. The operation method of claim 13, wherein the read operation comprises:
selecting an anti-fuse transistor to be read, applying a third voltage to a selection transistor gate line of a selection transistor electrically connected to the anti-fuse transistor to be read, and setting other selection transistor gate lines to be floating;
applying a fourth voltage to a bit line electrically connected to the anti-fuse transistor to be read, and setting other bit lines to be floating;
applying a fifth voltage to an anti-fuse transistor gate line of the anti-fuse transistor to be read, and setting other anti-fuse transistor gate lines to be floating; and
setting all blow enable lines to be floating,
wherein the third voltage is a turn-on voltage of the selection transistor, and an absolute value of a difference between the fourth voltage and the fifth voltage is smaller than a breakdown voltage of a gate dielectric layer of the anti-fuse transistor to be read.

* * * * *